United States Patent
Jentzsch et al.

[11] Patent Number: 5,927,205
[45] Date of Patent: Jul. 27, 1999

[54] APPARATUS FOR CLEANING CYLINDRICAL SURFACES

[75] Inventors: Arndt Jentzsch, Coswig; Reinhard Nerger, Radebeul; Volker Kessler, Freiberg, all of Germany

[73] Assignee: KBA-Planeta AG, Germany

[21] Appl. No.: 09/088,570

[22] Filed: Jun. 2, 1998

[30]  Foreign Application Priority Data

Jun. 4, 1997 [DE] Germany .......................... 197 23 310

[51] Int. Cl.⁶ .................................................. B41F 35/00
[52] U.S. Cl. ........................................... 101/424; 101/423
[58] Field of Search .................................... 101/424, 423, 101/425; 15/256.51, 256.52, 256.53

[56]  References Cited

U.S. PATENT DOCUMENTS

| | | | |
|---|---|---|---|
| 2,202,812 | 6/1940 | Davis .................................. | 15/256.52 |
| 3,309,993 | 3/1967 | Grembecki et al. .................... | 101/425 |
| 3,976,007 | 8/1976 | Junghans et al. ....................... | 101/425 |
| 4,392,742 | 7/1983 | Landa .................................... | 15/256.52 |
| 5,241,908 | 9/1993 | Tateishi .................................. | 101/423 |
| 5,524,805 | 6/1996 | Shiba et al. ............................. | 101/425 |
| 5,730,057 | 3/1998 | Loftus et al. ........................... | 101/425 |
| 5,746,130 | 5/1998 | Andl et al. .............................. | 101/425 |
| 5,784,963 | 7/1998 | Schmid .................................. | 101/425 |

FOREIGN PATENT DOCUMENTS 196 00 846
  C1  4/1997  Germany .

*Primary Examiner*—Edgar Burr
*Assistant Examiner*—Anthony H. Nguyen
*Attorney, Agent, or Firm*—Schweitzer Cornman Gross & Bondell LLP

[57]  ABSTRACT

An apparatus for developing a cylindrical surface in a printing press that has a device for writing and/or imaging on a rotatable printing form cylinder, the cylinder having a silicon-containing operating surface, the apparatus comprising a rotatable cleaning roller, an elastic cover and a fabric blanket over the cleaning roller, the cleaning roller having an optionally wettable cleaning surface, means for rotating the cleaning roller synchronously with or in opposition to the rotation of the printing form cylinder, means for selectively establishing and breaking contact between the cleaning roller and the printing form cylinder, whereby silicon particles created on the operating surface during writing and/or imaging are removed by contact between the operating surface and the cleaning cylinder.

10 Claims, 2 Drawing Sheets

APPARATUS FOR CLEANING CYLINDRICAL SURFACES

FIELD OF INVENTION

The invention relates to apparatus for developing cylindrical surfaces in printing presses with at least one integrated writing or imaging device on the operating surfaces of a printing form cylinder.

BACKGROUND OF INVENTION

The operating surface of the printing form cylinder in printing presses with a special integrated writing or imaging device normally has an ink-repellent silicon layer and an ink-carrying image layer. The silicon layer is converted to particles during writing and/or imaging of the operating surfaces and is thus uncovering the deeper ink-carrying layer. These silicon particles must be removed in a development step following the writing and/or imaging. This removal is difficult because the silicon particles stick in the deeper zones especially in the boundary regions.

A device for removal of silicon particles created during the direct writing and/or imaging is described in German patent No. 19600486 C1. Part of the device is a soft rubber jib running over the entire width of the printing form. The rubber jib is followed in the rotational direction of the printing form cylinder by a suction device for fetching loosened silicon particles, which is followed by an particle pickup adhesive roller. Additional means are provided for dampening and traversing of the rubber jib.

Disadvantages of this device include that the operating elements of the rubber jib, the suction device and the adhesive roller are arranged successively in the rotational direction of the printing form cylinder thus leading to large space requirements and problems in the accessibility of the printing form cylinder. It is a further disadvantage that the device securely removes only those partially loosened silicon particles which are located in the boundary regions of the deeper areas in the circumferential direction, or in the axial direction in front related to the rotational direction of the printing form cylinder. This requires additional measures also to remove the partially loosened silicon particles in the boundary regions in axial direction but in rear related to the rotational direction of the printing form cylinder.

SUMMARY DESCRIPTION OF INVENTION

It is an object of the present invention to create an apparatus for developing cylindrical surfaces with low space requirements and simple means which enhances the efficiency of the printing press.

The foregoing objective is met by the present invention which provides an apparatus for developing a cylindrical surface in a printing press that has a device for writing and/or imaging on a rotatable printing form cylinder, the cylinder having a silicon-containing operating surface, the apparatus comprising a rotatable cleaning roller, an elastic cover and a fabric blanket over the cleaning roller, the cleaning roller having an optionally wettable cleaning surface, means for rotating the cleaning roller synchronously with or in opposition to the rotation of the printing form cylinder, means for selectively establishing and breaking contact between the cleaning roller and the printing form cylinder, whereby silicon particles created on the operating surface during writing and/or imaging are removed by contact between the operating surface and the cleaning cylinder.

BRIEF DESCRIPTION OF DRAWINGS

The invention is described below in greater detail by an example of embodiment of the invention, by reference being had to the drawing, wherein.

DETAILED DESCRIPTION

Figure 1:
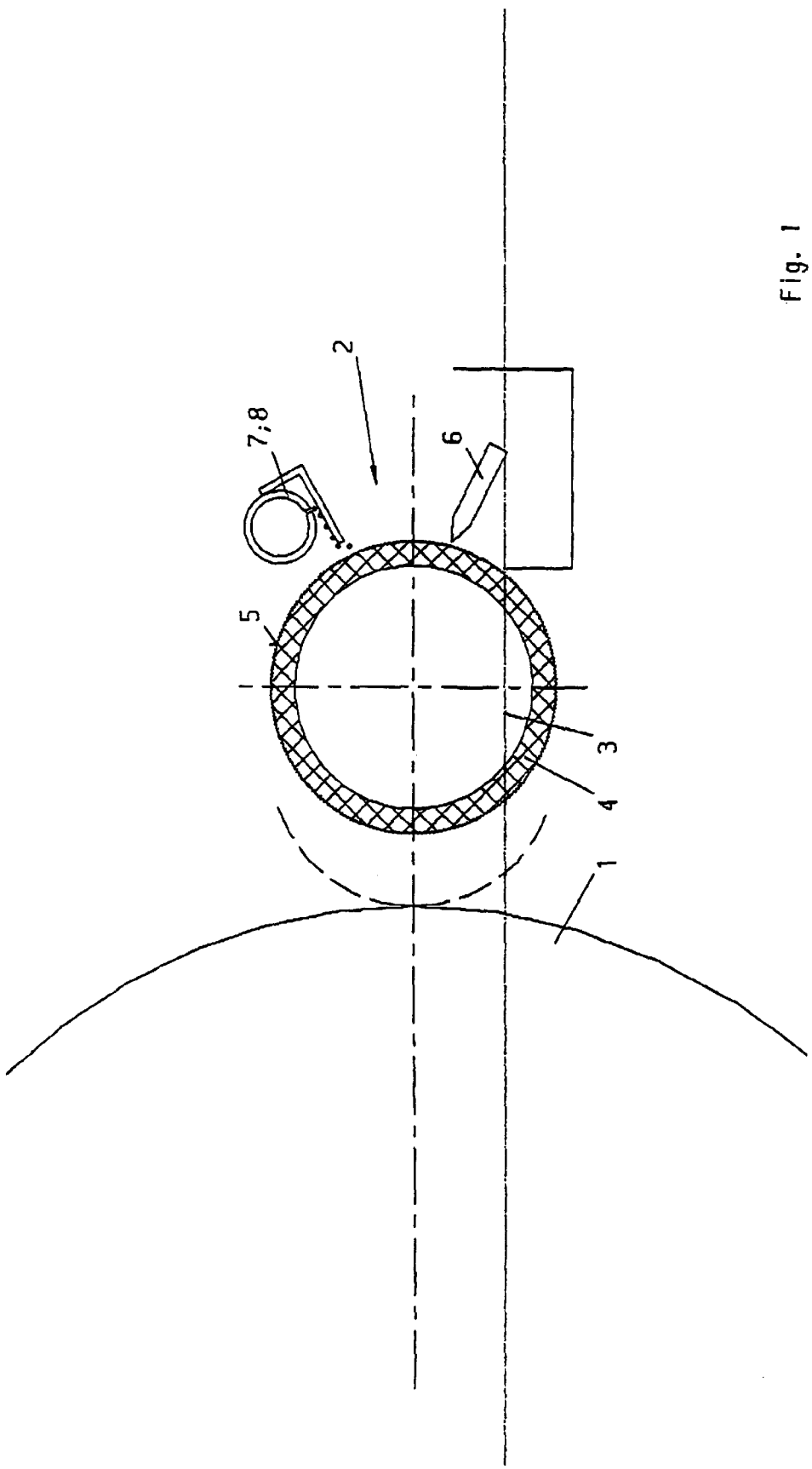
FIG. 1 is a schematic drawing of a printing form cylinder with the cleaning apparatus.
Figure 2:
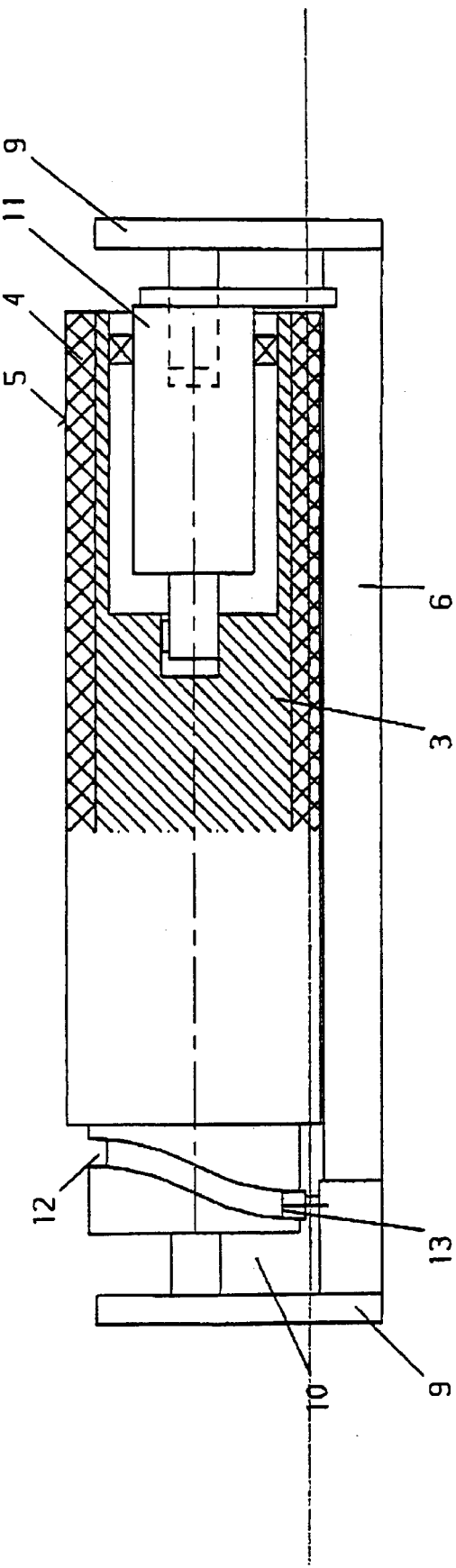
FIG. 2 is a top view of the apparatus of FIG. 1.

FIG. 1 shows a printing form cylinder 1 whose operating surfaces are being written and/or imaged by a writing or imaging device (not shown), and is provided with a cleaning apparatus 2 for removal of silicon particles created during writing and/or imaging on the operating surfaces. The cleaning apparatus 2 is a functional unit having a cleaning roller 3, which has an elastic cover 4 carrying a fabric blanket 5. A doctor blade 6 stretching over the width of the cleaning roller 3 can be set to contact the cleaning roller 3. Furthermore a dampening device 7 is provided for dampening the fabric blanket 5 of the cleaning roller 3 with cleaning fluid. The dampening device 7 is a drip feed pipe 8 in the described suitable embodiment of the present invention. The cleaning roller 3 is movable in the axial direction within the side frames 9 of a tray 10. The tray 10 is movable in a frame (not shown). The cleaning roller 3 is rotated by a motor 11 located inside the cleaning roller and is mounted from the side frame 9 of the tray 10. The cleaning roller 3 has a cylindrical cam 12 affixed thereto which is contacted by a stationary cam follower 13 (FIG. 2), for imparting axial motion to the cleaning roller.

The cleaning apparatus 2 is shown in FIG. 1 in its withdrawn or resting position (in solid lines), and it can be moved by means (not shown) into a working position (in broken lines) in which the cleaning roller is in operating contact witch the printing form cylinder 1.

It has been surprisingly found that if the cleaning roller 3 with its elastic cover 4 and the fabric blanket 5 is in operating contact with the printing form cylinder 1, it not only completely removes the silicon particles loosened through writing and/or imaging of the operating surfaces of the printing form cylinder 1 with the writing and/or imaging device, but also effectively removes the only partially loosened silicon particles in the boundary regions of the deeper ink-carrying areas. In that case the peripheral speed of the cleaning roller 3 is smaller than the circumferential speed of the printing form cylinder 1. Suitably the two can rotate synchronously or in opposite directions. The cleaning roller 3 can be engaged dry or moistened to the printing surface of the form cylinder 1. A wet cleaning roller 3 leads to particularly good results during the developing of the operating surfaces of the printing form cylinder 1, if a soap solution is used as dampening agent.

It is also possible to clean the curved surfaces of other rollers and/or cylinders in a printing press by other cleaning devices (not shown) with the cleaning roller 3, or respectively with the cleaning apparatus 2 which includes the cleaning roller 3 used for the removal of silicon particles in the operating surfaces of the printing form cylinder created during writing and/or imaging.

We claim:

1. An apparatus for cleaning a cylindrical surface in a printing press that has a rotatable printing form cylinder, a device for writing and/or imaging on the rotatable printing form cylinder, the cylinder having a silicon-containing operating surface, the apparatus comprising a rotatable cleaning roller, an elastic cover and a fabric blanket over said cleaning roller, said cleaning roller having an wettable cleaning surface, means for rotating said cleaning roller means for selectively establishing and breaking contact between said cleaning roller and the printing form cylinder, whereby silicon particles formed on the operating surface during writing and/or imaging are removed by contact between the operating surface and said cleaning cylinder.

2. The apparatus of claim 1, wherein the cleaning roller makes a traverse movement.

3. The apparatus of claim 1, wherein the peripheral speed of said rotatable cleaning roller is lower than the peripheral speed of the rotatable printing form cylinder.

4. The apparatus of claim 1, wherein the printing form cylinder and the cleaning roller are adapted to rotate in opposite directions.

5. The apparatus of claim 1, further comprising a mount for rotatably disposing said cleaning roller therein, a firm peripheral cam surface formed with said cleaning roller, and a cam follower for imparting axial motion to said cleaning roller.

6. The apparatus of claim 1, further comprising a dampening device for supplying a wetting fluid to the cleaning roller.

7. The apparatus of claim 6, wherein said wetting fluid is a soap solution.

8. The apparatus of claim 6, further comprising a doctor blade for contacting the surface of said cleaning roller.

9. The apparatus of claim 1, wherein said means for rotating said cleaning roller comprises an electric motor disposed within said cleaning roller.

10. Apparatus for cleaning a printing form cylinder surface containing silicon, from individual silicon particles formed during writing to or imaging on the surface that contains silicon, which comprises a rotatable cleaning roller, having an elastic cover and a textile blanket thereover, means for wetting said cover and/or blanket, and a doctor blade for obtaining uniform wetting.

* * * * *